(12) United States Patent
Gupta et al.

(10) Patent No.: US 6,656,643 B2
(45) Date of Patent: Dec. 2, 2003

(54) METHOD OF EXTREME ULTRAVIOLET MASK ENGINEERING

(75) Inventors: Subhash Gupta, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 106 days.

(21) Appl. No.: 09/785,116

(22) Filed: Feb. 20, 2001

(65) Prior Publication Data

US 2002/0115000 A1 Aug. 22, 2002

(51) Int. Cl.$^7$ .................................................. G03F 9/00
(52) U.S. Cl. ............................................................ 430/5
(58) Field of Search ........................... 430/5, 322, 323, 430/324, 311, 312; 378/34, 35

(56) References Cited

U.S. PATENT DOCUMENTS

| | | | |
|---|---|---|---|
| 4,326,911 A | 4/1982 | Howard et al. | 156/643 |
| 4,557,797 A | 12/1985 | Fuller et al. | 156/643 |
| 5,023,164 A | 6/1991 | Brunsvold et al. | 430/270 |
| 5,237,037 A | 8/1993 | Ebersole | 528/153 |
| 5,248,636 A * | 9/1993 | Davis et al. | 437/225 |
| 5,324,620 A | 6/1994 | Ebersole | 430/192 |
| 5,346,799 A | 9/1994 | Jeffries, III et al. | 430/192 |
| 5,521,031 A | 5/1996 | Tennant et al. | 430/5 |
| 5,541,033 A | 7/1996 | Blakeney et al. | 430/192 |
| 5,547,814 A | 8/1996 | Blakeney et al. | 430/326 |
| 5,585,012 A | 12/1996 | Wu et al. | 216/71 |
| 5,602,260 A | 2/1997 | Blakeney et al. | 549/362 |
| 5,641,593 A | 6/1997 | Watanabe et al. | 430/5 |
| 5,667,650 A | 9/1997 | Face et al. | 204/298.07 |
| 5,891,350 A | 4/1999 | Shan et al. | 216/71 |
| 5,935,737 A | 8/1999 | Yan | 430/5 |
| 5,958,629 A | 9/1999 | Yan et al. | 430/5 |
| 5,964,949 A | 10/1999 | Savas | 118/723 I |
| 6,013,399 A * | 1/2000 | Nguyen | 430/5 |
| 6,066,578 A | 5/2000 | Gupta et al. | 438/790 |
| 6,146,793 A | 11/2000 | Schaedeli et al. | 430/18 |
| 6,159,863 A | 12/2000 | Chen et al. | 438/720 |
| 6,333,961 B1 * | 12/2001 | Murakami | 378/35 |
| 6,355,381 B1 * | 3/2002 | Yan et al. | 430/5 |

FOREIGN PATENT DOCUMENTS

| | | | |
|---|---|---|---|
| EP | 0671658 A2 | 9/1995 | G03F/1/14 |
| EP | 0840361 A2 | 5/1998 | H01L/21/027 |
| GB | 2302759 | 1/1997 | H01L/21/31 |
| WO | WO 00/31782 | 6/2000 | H01L/21/027 |

* cited by examiner

*Primary Examiner*—S. Rosasco
(74) *Attorney, Agent, or Firm*—George O. Saile; Rosemary L.S. Pike; Stephen G. Stanton

(57) ABSTRACT

An EUV photolithographic mask device and a method of fabricating the same. The EUV photolithographic mask comprises a multi-layer over an EUV masking substrate and a patterned light absorbing layer formed on the multi-layer. The method comprises the steps of forming a multi-layer on an EUV mask substrate, forming a light absorbing layer on the multi-layer, and etching an opening through the light absorbing layer to the multi-layer. The light absorbing layer includes a metal selected from the group comprising nickel, chromium, cobalt, and alloys thereof, and is preferably nickel.

24 Claims, 3 Drawing Sheets

METHOD OF EXTREME ULTRAVIOLET MASK ENGINEERING

FIELD OF THE INVENTION

The present invention relates generally to photolithographic mask fabrication, and specifically to a method of extreme ultraviolet mask engineering.

BACKGROUND OF THE INVENTION

Extreme ultraviolet is the most commonly accepted solution for next generation lithography (NGL). The mask is a reflective system having up to 50 pairs of multi-layer materials and the absorber layer patterned with low temperature processes. The current two basic EUV mask patterning approaches (Direct Metal Patterning and Damascene Process) involves multi-steps of etching/film deposition/chemical mechanical polishing (CMP) process.

U.S. Pat. No. 5,958,629 to Yan et al. describes a method of fabricating EUV masks by forming an etch stop layer over the surface of a mask to create a more controllable etch profile for etching patterns into the material above the etch stop layer.

U.S. Pat. No. 5,935,737 to Yan describes a method of fabricating EUV masks using dual defect-absorbing layers to ensure that through two steps of repair, the repair stains are eliminated on that section of the mask which must cleanly reflect light in the case of a reflective mask, or transmit light in the case of a transmissive mask.

U.S. Pat. No. 5,521,031 to Tenant et al. describes a method of fabricating EUV masks by incorporating the operating principle of the attenuated phase mask in a reflecting structure. The apparatus serves as an alternative, or supplement, to a surface-activated resist to permit projection-reduction lithography with improved image edge definition.

SUMMARY OF THE INVENTION

Accordingly, it is an object of the present invention to provide EUV masks and a method of fabricating the EUV masks using less processing steps.

Another object of the present invention is to provide EUV masks and a method of fabricating the EUV masks using low processing temperatures.

Yet another object of the present invention is to provide EUV masks and a method of fabricating the EUV masks with minimum sub-layer damage.

A further object of the present invention is to provide an easier and more economic method of fabricating EUV masks.

Another object of the present invention is to use nickel (Ni) as an absorber layer instead of chromium (Cr) allowing for a relatively low temperature etch.

Other objects will appear hereinafter.

It has now been discovered that the above and other objects of the present invention may be accomplished in the following manner. The EUV photolithographic mask comprises a multi-layer over an EUV masking substrate and a patterned light absorbing layer formed on the multi-layer. The method comprises the steps of forming a multi-layer on an EUV mask substrate, forming a light absorbing layer on the multi-layer, and etching an opening through the light absorbing layer to the multi-layer. The light absorbing layer includes a metal selected from the group comprising nickel, chromium and cobalt and is preferably nickel.

BRIEF DESCRIPTION OF THE DRAWINGS

The features and advantages of the method of fabricating EUV masks according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art. While not limited to a particular application, the invention is particularly useful for extreme ultraviolet lithography (EUVL) that is preferably conducted at wavelength of between 3 and 50 nanometers (nm) and is intended for use in chip fabrication where minimum line widths of $\leq 0.07$ micron are required.

Two Processes Known to the Inventors

Process One

Figure 1:
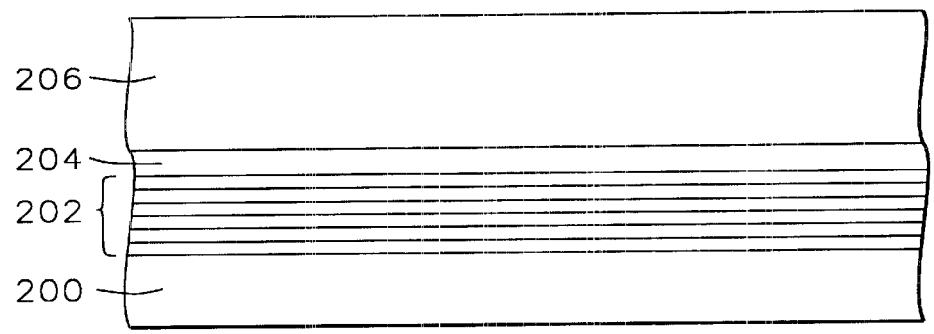
FIGS. 1 and 2 schematically illustrate in cross-sectional representation a Direct Metal Patterning Process of forming EUV masks known to the inventors.
Figure 2:
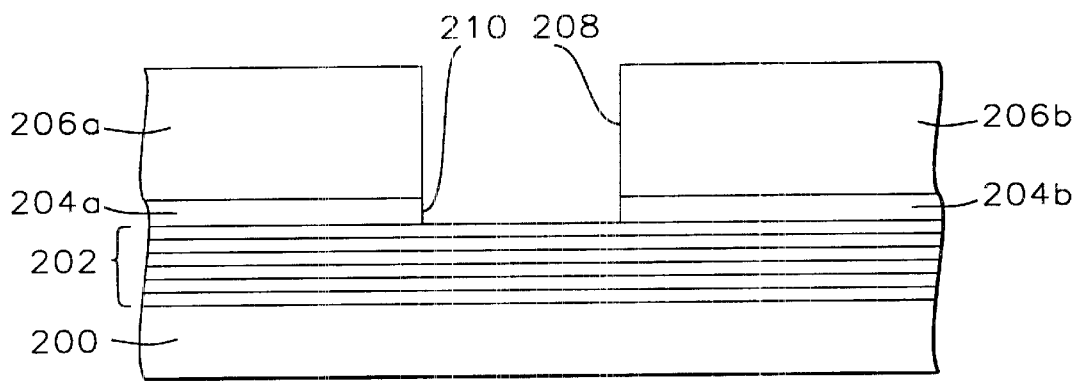

FIGS. 1 and 2 illustrate a Direct Metal Patterning Process of forming EUV masks known to the inventors.

As shown in FIG. 1, reflector layer 202 is formed over mask blank 200. Buffer layer 204, that may be comprised of $SiO_2$, is then deposited over reflector layer 202. Metal layer 206, that may be comprised of Al, TaSi, Cr, SiON, Ti, of TiN, is deposited over buffer layer 204.

As shown in FIG. 2, metal layer 206 is then patterned by, for example, depositing and patterning a photoresist layer (not shown) over metal layer 206, then etching metal layer 206 to form metal layer trench 208 exposing a portion of underlying buffer layer 204. The exposed portion of buffer layer 204 is then etched to form buffer layer trench 210 beneath metal layer trench 208.

Optionally (not shown) a layer of silicon (Si) may be deposited and chemically mechanically polished (CMP) to complete formation of the Direct Metal Patterning photolithographic mask.

Process Two

Figure 3:
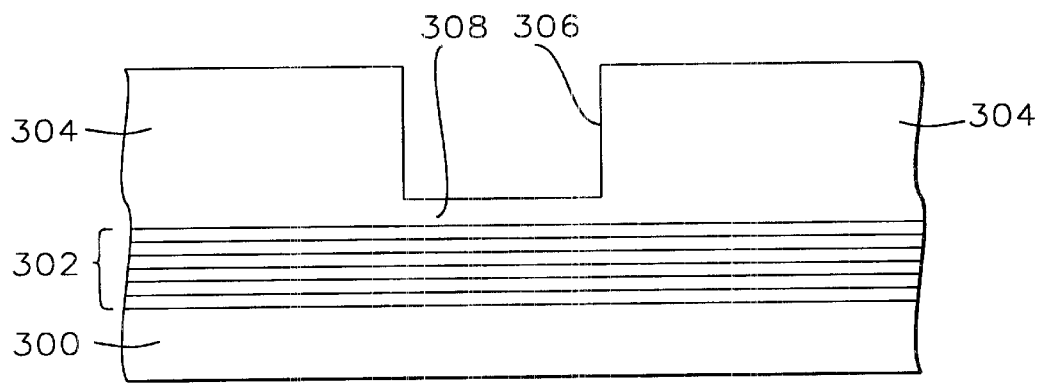
FIGS. 3 and 4 schematically illustrate in cross-sectional representation a Damascene Process of forming EUV masks known to the inventors.
Figure 4:
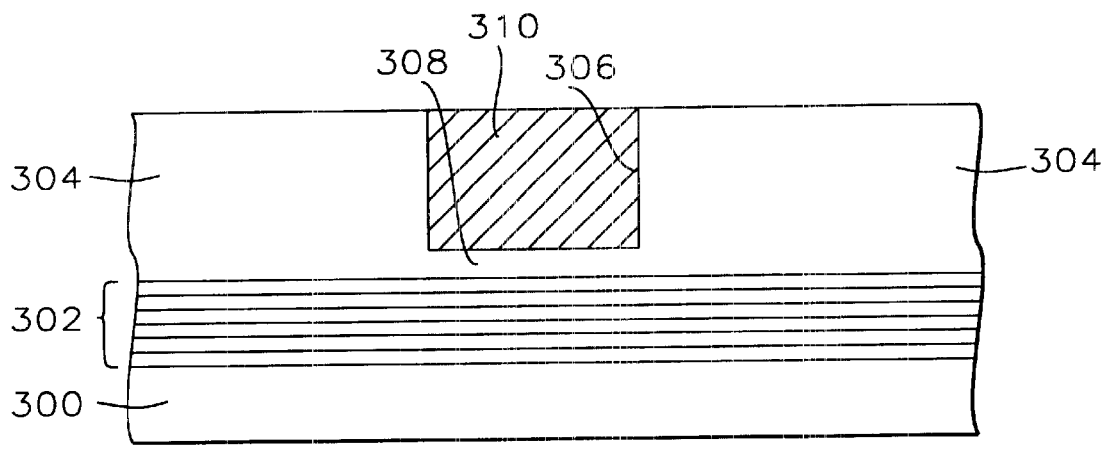

FIGS. 3 and 4 illustrate a Damascene Process of forming EUV masks known to the inventors.

As shown in FIG. 3, a multi-layer reflector layer 302 is formed over mask blank 300. Silicon cap layer 304 is then formed over reflector layer 302. Silicon cap layer 304 is then etched to form trench 306 leaving bottom portion 308 of silicon cap layer beneath trench 306.

The structure is then inspected for defects and any necessary repairs are effected.

A metal layer (not shown) is deposited over the structure, filling trench 306, and planarized by chemical mechanical polishing (CMP) to form planarized metal portion 310 over silicon cap layer portion 308.

Optionally (not shown) a layer of silicon (Si) may be deposited and chemically mechanically polished (CMP) to complete formation of the Damascene photolithographic mask.

However, both the Direct Metal Patterning Process of FIGS. 1 and 2 and the Damascene Process of FIGS. 3 and 4 in forming photolithographic masks involve multiple steps of (at least) etching, stripping of a patterned photoresist layer (not shown), deposition of a film, and planarization of the film by chemical mechanical polishing.

Further, it is a great challenge to make EUV masks with low temperature, low defects, and no multi-layer reflector layer damage.

PREFERRED EMBODIMENT OF THE PRESENT INVENTION

Accordingly as shown in FIGS. 5–8, multi-reflector layer 12 is formed over mask blank 10 to form a mask substrate. Mask blank 10 is any material suitable for the type of photolithography wavelength regime to be used. For extreme ultraviolet lithography (EUVL), mask blank 10 is preferably either silicon or fused silica with a highly polished surface.

Reflector layer 12 preferably consists of multiple layers of alternating reflecting material and transmissive material. Various combinations of reflective and transmissive materials may be used such as Mo/Si, Ru/C, Ru/B$_4$C, Mo/Be, etc. The reflector layer is preferably comprised of molybdenum (Mo) and silicon (Si) layers (Mo/Si), each layer with a thickness of about (lambda/2) (sin) (theta). Where lambda is the wavelength of the light, and theta is the incident angle. The reflector layer 12 has preferably from about 40 to 50 paired layers.

Light absorbing layer 14 is deposited over reflector layer 12 preferably to a thickness of from about 200 to 500 Å, and more preferably from about 250 to 350 Å. Light absorbing layer 14 is comprised of a material selected for its characteristics of being absorptive to the wavelength of light to be used and for its ease in mask fabrication.

Specifically, light absorbing layer 14 may be comprised of a metal selected from the group nickel (Ni), chromium (Cr), and cobalt (Co) and alloys thereof.

In a key step of the invention, light absorbing layer 14 is most preferably comprised of nickel (Ni) as will be used hereafter for the purposes of example. The use of a nickel light absorbing layer 14 permits a low temperature etch.

Figure 5:
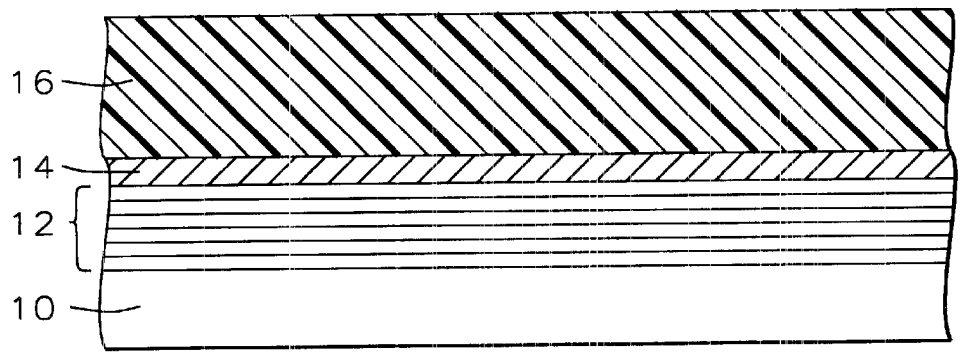
FIGS. 5 through 8 schematically illustrate in cross-sectional representation a preferred embodiment of the present invention.

Light absorbing layer 14 is then patterned, for example, as shown in FIG. 5, by deposited a suitable photoresist (PR) layer 16 over Ni layer 14 to an appropriate thickness.

Figure 6:
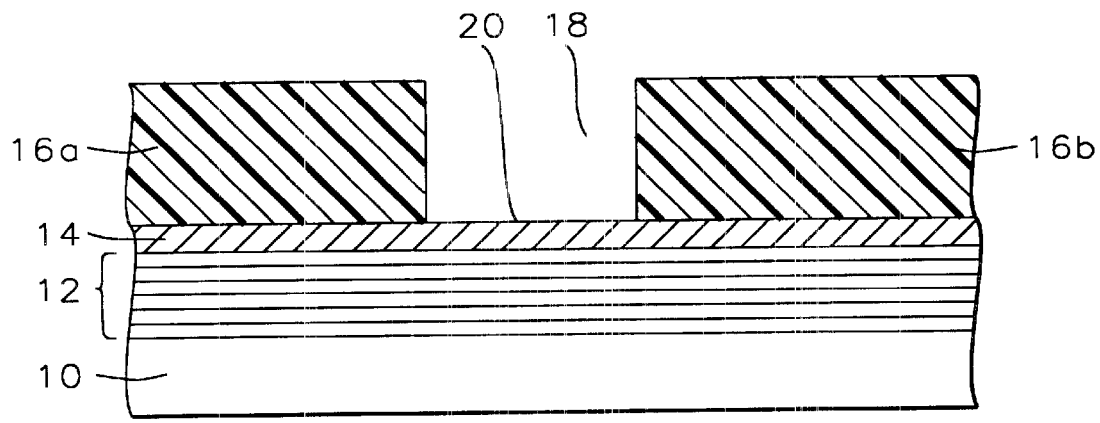

As shown in FIG. 6, PR layer 16 is patterned forming PR trench 18, and exposing portion 20 of Ni layer 14. PR layer 16 is split into portions 16a, 16b. The photoresist is exposed and developed using conventional processes.

Figure 7:
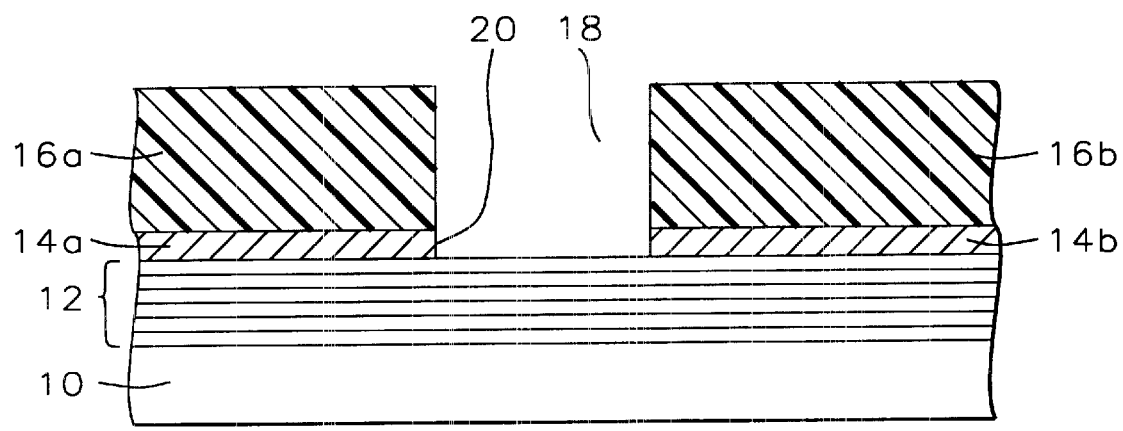

As shown in FIG. 7, in an important step in the present invention, light absorbing layer 14 is etched by a highly selective, low temperature, low power and with no bias power to minimize to the bombardment. The etch splits layer 14 into portions 14a, 14b and forming light absorbing layer trench 22. That is, the temperature is lower that about 40° C. and preferably between about 0 to 39° C.; the inductive coil power is less than about 350 watts (W) and preferably between about 100 to 200 watts; preferably at a CO gas flow between about 50 and 400 sccm, more preferably between about 200 and 350 sccm, and most preferably about 300 sccm; preferably from about 8 to 12 milli torr and more preferably about 10 milli torr, and with no bias power being applied to minimize the bombardment.

This etch is conducted by a reactive ion etching (RIE) plasma etcher, such as the IPS, IEM, DRM, or TCP etcher and preferably the Lam transformer-coupled plasma source TCP9100 PTX. The etching conditions depend upon the specific plasma etcher selected.

This etch does not create a side-wall polymer because the etch products are very volatile at the low temperature at which the etch is possible because nickel is selected as comprising light absorbing layer 14.

The reaction during the Ni layer etch is:

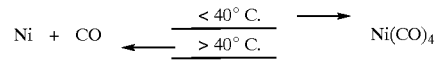

Figure 8:
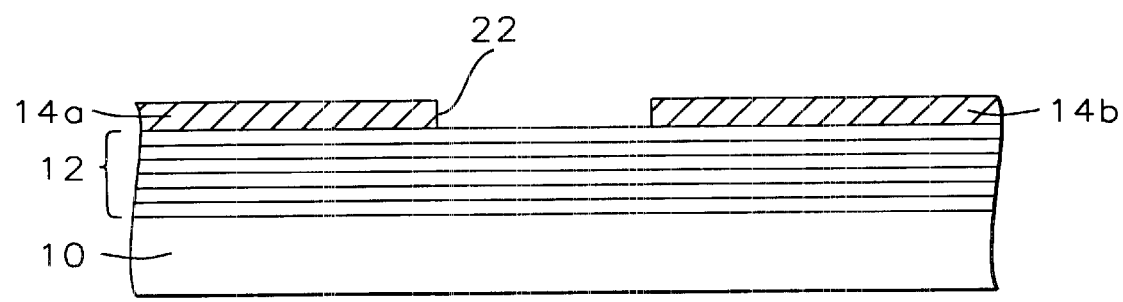

As shown in FIG. 8, remaining PR layer portions 16a, 16b are stripped and removed. The PR strip may be accomplished by ozone (O$_3$) injected into hot water, that is by the Hydrozone Process by Fluorowave System Inc. (FSI) with the water at 85° C. Alternatively, the PR strip can be accomplished by a SO$_3$ strip process developed by Anon Inc. at $\leq 50°$ C.

The structure is then subject to defect inspection and repair by any standard technique using any standard tool. Any defects are identified visually by type, clear or opaque, and by location. An ion beam is used, usually in a focused gallium ion beam system, to either create patches in the structure or remove unwanted material arising from any such defects.

The ability to use the low temperature, low power and minimum bombardment etch of nickel light absorbing layer 14 allows one to retain the reflecting properties of the mirror (mask) due to the absence of thermal interdiffusion between the layers, thus permitting fabrication of quality EUV photolithographic masks.

While particular embodiments of the present invention have been illustrated and described, it is not intended to limit the invention, except as defined by the following claims.

We claim:

1. A method of fabricating a photolithographic EUV mask device, comprising the steps of:
    forming a multi-layer on an EUV mask substrate;
    forming a light absorbing layer on said multi-layer; said light absorbing layer being comprised of nickel; and then
    etching an opening through said light absorbing layer to said multi-layer under the following conditions:
        a temperature of less than about 40° C.:
        an inductive coil power of less than about 350 watts;
        a CO gas flow of from about 50 to 400 sccm;
        a pressure of from about 8 to 12 milliTorr; and
        no bias power.
2. The method of claim 1, wherein said light absorbin layer is from about 200 to 500 Å thick.
3. The method of claim 1, wherein said light absorbin layer is from about 250 to 350 Å thick.
4. The method of claim 1, wherein said mask substrate includes a reflective surface.
5. The method of claim 1, wherein said opening etching is conducted in an conductivity coupled RF plasma etcher.
6. The method of claim 1, wherein said opening is etched through said light absorbing layer to said multi-layer using a dry etch process.
7. The method of claim 1, wherein said light absorbing layer is not a silicide layer.
8. The method of claim 1, wherein the opening is etched under the following conditions:
    a temperature of from about 0 to 39° C.;

an inductive coil power of from about 100 to 200 watts;

a CO gas flow of from about 200 to 350 sccm; and a pressure of about 10 milliTorr.

9. The method of claim 1, wherein the opening is etched at a CO gas flow of about 300 sccm.

10. A method of fabricating a photolithographic EUV mask device, comprising the steps of:

forming a multi-layer on an EUV mask substrate;

forming a metal layer on said multi-layer; said metal layer being comprised of nickel;

forming a photoresist layer over said metal layer;

patterning said photoresist layer exposing a portion of said metal layer; and then etching said exposed portion of said metal layer forming an opening through said metal layer to said multi-layer under the following conditions:

a temperature of less than about 40° C.;

an inductive coil power of less than about 350 watts;

a CO gas flow of from about 50 to 400 sccm;

a pressure of from about 8 to 12 milliTorr; and no bias power.

11. The method of claim 10, wherein said metal layer is from about 200 to 500 Å thick.

12. The method of claim 10, wherein said metal layer is from about 250 to 350 Å thick.

13. The method of claim 10, wherein said mask substrate includes a reflective surface.

14. The method of claim 10, wherein said exposed portion of said metal layer is etched using a dry etch process.

15. The method of claim 10, wherein said metal layer is not a silicide layer.

16. The method of claim 10, wherein the opening is etched under the following conditions:

a temperature of from about 0 to 39° C.;

an inductive coil power of from about 100 to 200 watts;

a CO gas flow of from about 200 to 350 sccm; and a pressure of about 10 milliTorr.

17. The method of claim 10, wherein the opening is etched at a CO gas flow of about 300 sccm.

18. A method of fabricating a photolithographic EUV mask device, comprising the steps of:

forming a multi-layer on an EUV mask substrate;

forming a non-silicide light absorbing layer on said multi-layer; said non-silicide light absorbing layer being comprised of nickel; and the etching an opening through said non-silicide light absorbing layer to said multi-layer using a dry etch process under the following conditions:

a temperature of less than about 40° C.;

an inductive coil power of less than about 350 watts;

a CO gas flow of from about 50 to 400 sccm;

a pressure of from about 8 to 12 milliTorr; and no bias power.

19. The method of claim 18, wherein said light absorbing layer is from about 200 to 500 Å thick.

20. The method of claim 18, wherein said light absorbing layer is from about 250 to 350 Å thick.

21. The method of claim 18, wherein said mask substrate includes a reflective surface.

22. The method of claim 18, wherein said opening etching is conducted in an conductivity coupled RF plasma etcher.

23. The method of claim 18, wherein the opening is etched under the following conditions:

a temperature of from about 0 to 39° C.;

an inductive coil power of from about 100 to 200 watts;

a CO gas flow of from about 200 to 350 sccm; and a pressure of about 10 milliTorr.

24. The method of claim 18, wherein the opening is etched at a CO gas flow of about 300 sccm.

* * * * *